US005679167A

United States Patent [19]

Muehlberger

[11] Patent Number: 5,679,167

[45] Date of Patent: Oct. 21, 1997

[54] PLASMA GUN APPARATUS FOR FORMING DENSE, UNIFORM COATINGS ON LARGE SUBSTRATES

[75] Inventor: Erich Muehlberger, San Clemente, Calif.

[73] Assignee: Sulzer Metco AG, Wohlen, Switzerland

[21] Appl. No.: 292,399

[22] Filed: Aug. 18, 1994

[51] Int. Cl.$^6$ .................................................. C23C 16/00

[52] U.S. Cl. .............................. 118/723 DC; 118/723 E; 118/718; 118/620; 219/76.16; 219/121.47; 219/121.48; 219/121.5; 219/121.52

[58] Field of Search ......................... 118/723 E, 723 DC, 118/308, 309, 323, 324, 620, 718; 219/76.16, 121.36, 121.47, 121.48, 121.5, 121.52, 121.59; 315/111.21; 427/446

[56] References Cited

U.S. PATENT DOCUMENTS

| | | | |
|---|---|---|---|
| B1 432,257 | 9/1987 | Muehlberger . | |
| 3,311,735 | 3/1967 | Winzeler | 219/121 |
| 3,839,618 | 10/1974 | Muehlberger | 219/76 |
| 4,328,257 | 5/1982 | Muehlberger et al. | 247/34 |
| 4,596,718 | 6/1986 | Gruner | 427/34 |
| 4,689,468 | 8/1987 | Muehlberger | 219/121 PL |
| 4,851,636 | 7/1989 | Sugimoto | 219/121.59 |
| 4,912,361 | 3/1990 | Muehlberger | 313/30 |
| 4,920,917 | 5/1990 | Nakatani | 118/718 |
| 5,203,924 | 4/1993 | Mitani | 118/723 |
| 5,217,747 | 6/1993 | Tsantrizos | 427/455 |
| 5,235,160 | 8/1993 | Suzuki | 219/121.59 |
| 5,239,161 | 8/1993 | Lang | 219/121.47 |
| 5,308,977 | 5/1994 | Oishi | 250/288 |
| 5,382,293 | 1/1995 | Kawarada | 118/723 DC |
| 5,412,173 | 5/1995 | Muehlberger | 219/121.47 |
| 5,437,725 | 8/1995 | Schuster | 118/718 |
| 5,464,667 | 11/1995 | Kohler | 427/577 |
| 5,556,560 | 9/1996 | Ahola et al. | 219/121.45 |
| 5,560,779 | 10/1996 | Knowles et al. | 118/723 MP |
| 5,565,249 | 10/1996 | Kurihara et al. | 427/577 |
| 5,573,682 | 11/1996 | Beason, Jr. et al. | 219/121.5 |

FOREIGN PATENT DOCUMENTS

| | | | |
|---|---|---|---|
| 1-252781 | 10/1989 | Japan | 118/723 DC |

*Primary Examiner*—Richard Bueker
*Assistant Examiner*—Jeffrie R. Lund
*Attorney, Agent, or Firm*—Loeb & Loeb LLP

[57] ABSTRACT

A plasma system forms a dense, uniform coating of metallic oxide or other material on a relatively large substrate of metal foil or other composition located a substantial distance from the plasma gun so that the plasma stream covers the entire width of the substrate. A large pressure differential between the pressure inside the plasma gun and the ambient pressure outside of the plasma gun creates a shock pattern within the exiting plasma-stream so as to disperse the plasma stream and maintain a high energy level therein, as well as thoroughly mixing a coating material introduced into the plasma stream within the gun. Mixing of the coating material within the plasma stream is further enhanced by introducing the coating material into the plasma stream in the form of very small particles. In one arrangement, the plasma stream is delivered in a long, narrow configuration across the width of the substrate by a nozzle with a slit-like opening at the lower end of the plasma gun. In still other arrangements, a plasma stream of elongated configuration is provided by a plasma gun of elongated configuration having an elongated cathode assembly disposed within the hollow interior of an elongated anode having a nozzle-forming slot therein.

16 Claims, 8 Drawing Sheets

PLASMA GUN APPARATUS FOR FORMING DENSE, UNIFORM COATINGS ON LARGE SUBSTRATES

BACKGROUND OF THE INVENTION

1. Field of the Invention

The present invention relates to systems for forming uniform thin coatings of metallic oxides or other materials on large substrates of metallic or other composition, and more particularly to plasma systems for thermally spraying relatively uniform coatings onto workpieces of large size.

2. History of the Prior Art

Various applications require that a relatively thin coating of metallic oxide or other material be formed on a relatively large substrate such as of aluminum or other composition. Such substrates are often provided in the form of a roll of substantial width on the order of three feet or greater and having a length which may be hundreds of feet or more.

Various processes have been used for coating substrates of substantial width. One such method, which is electrolytic in nature, involves immersion of the substrate in an electrolyte in the presence of electrodes having a potential difference therebetween. For example, aluminum, which tends to oxidize rapidly, is commonly anodized by forming a coating on the surface thereof using an electrolytic bath. Electrolytic processes of this type tend to be relatively difficult and expensive to carry out, and involve other disadvantages including particularly the amount of electrical power required for a given coating operation.

An alternative method of forming thin coatings on relatively large substrates involves a vapor coating technique. After preparing the substrate, material to be coated on the substrate in the form of a thin coating is vaporized, using one of various different methods such as that involving a vapor beam. The substrate is positioned in a chamber into which the formed vapor cloud is dispersed to form the desired thin coating on the substrate. Such vapor coating techniques involve a number of disadvantages, not the least of which is the large amount of electrical power required for a given coating operation. In addition, the vapor cloud within the chamber deposits a coating on various portions of the chamber as well as on the substrate, requiring periodic cleanout. Further problems arise when it is desired to deposit a mixture of different materials on the substrate. The different materials typically have different characteristics, requiring that the operating conditions for the vapor coating process be carefully controlled and monitored.

Plasma systems have provided a useful alternative for coating metallic oxides and other materials onto a substrate or other workpiece. However, while plasma systems have proven to be quite useful and effective for certain applications, such as the spraying of aircraft engine parts such as turbine blades, where the part to be coated is relatively small in size, such techniques have heretofore been limited in terms of their ability to spray substrates or other workpieces of relatively large size. The plasma stream or flame used to carry the material forming the coating on the substrate is typically of limited size for typical plasma spraying systems, so that only substrates of relatively small size can be sprayed with a relatively uniform coating. Making the plasma systems larger in size so as to increase the size of the plasma stream or flame and thereby the area sprayed often becomes impractical, among other reasons because of the substantially increased amounts of electrical power normally required to spray over the longer distances.

In a typical plasma spraying system, a plasma power source coupled between the anode and the cathode of a plasma gun combines with the introduction of a substantially inert gas in the region of the cathode to produce an arc within a central plasma chamber in the anode and a plasma stream flowing from the anode. The plasma stream is directed onto the substrate or other workpiece or target. Introduction of powdered material such as powdered metals or metallic oxides into the central plasma chamber of the anode enables the powdered material to be carried to and coated on the target by the plasma stream. Operation of the plasma gun may be carried out at atmospheric pressure, although for some applications it is preferred that a vacuum source be coupled to a closed chamber for the plasma gun to provide a low pressure environment and a supersonic plasma stream. Such a plasma system is described in U.S. Pat. No. 4,328,257 of Muehlberger et al., which patent issued May 4, 1982, is entitled "System and Method for Plasma Coating", and is commonly assigned with the present application. An earlier example of a plasma system for providing plasma spraying in a low pressure environment is described in U.S. Pat. No. 3,839,618 of Muehlberger, which patent issued Oct. 1, 1974 and is entitled "Method and Apparatus for Effecting High-Energy Dynamic Coating of Substrates".

The plasma systems described in the two above-mentioned patents are suitable for a variety of plasma applications. In some instances, however, it may be desirable or even necessary to provide a plasma gun of special configuration in order to effectively and efficiently cover a particular workpiece with the plasma stream. An example of such an arrangement is described in co-pending application Ser. No. 08/156,388, now U.S. Pat. No. 5,412,173, of Muehlberger, which application was filed Nov. 22, 1993, is entitled "High Temperature Plasma Gun Assembly" and is commonly assigned with the present application. The plasma gun described in the patent application is specifically designed for high temperature applications, such as where the plasma gun is located at the interior of a circular workpiece in order to spray the inner surface of the workpiece as the workpiece undergoes rotational motion relative to the plasma gun.

As noted above, one particular plasma application which poses problems, especially where attempt is made to utilize conventional plasma guns, involves directing a plasma stream onto a substrate or other workpiece or target of relatively large size. For example, spraying an elongated strip of material wound into a roll by advancing the elongated strip of material past the plasma gun is a difficult operation using conventional plasma systems if the roll is very wide. For such applications, it is difficult to spray the entire width of the material with any degree of uniformity, absent a very high-powered plasma gun capable of producing an especially large plasma flame. Such applications may require a very large and high-powered gun in order to produce a very large plasma flame. Moreover, even where such large, high-powered plasma guns are used, the resulting uniformity of spraying across the width of the elongated strip may be less than satisfactory.

It has been proposed to spray relatively wide workpieces, such as advancing elongated strips of material of substantial width, by disposing a plurality of plasma guns across the width of the material. In this manner, each of the plural plasma guns sprays a different portion of the width of the material. However, such arrangements have a number of limitations, including the difficulty in controlling a plurality of plasma guns in an attempt to achieve a relatively uniform coating of the material, as well as the power required to operate multiple guns.

It has also been proposed to spray relatively wide workpieces using plasma guns in which the opposite positive and negative electrodes are disposed at the opposite ends of an elongated, slit-like nozzle. A long drawn DC arc is produced between the positive and negative electrodes so as to extend across the width of the slit nozzle. Arc gas may be introduced at spaced-apart locations across the width of the arrangement so that the gas flows through the interior and out of the slit nozzle in a generally common direction perpendicular to the arc or electric current discharge between the opposite electrodes. Such arrangements, however, are troublesome and unsatisfactory for a number of reasons. For one thing, the temperature distribution across the slit nozzle tends to be highly non-uniform. In addition, it is difficult to introduce powder material across the width of the plasma gun so that such material flows from the slit nozzle in reasonably uniform fashion. As a result, the powder material tends to deposit in non-uniform fashion across the width of the advancing workpiece.

It would therefore be desirable to provide a plasma spraying system capable of spraying a relatively uniform coating on objects of various sizes, including very wide objects of elongated configuration, in a relatively simple, one-step operation. Such plasma spraying systems should be capable of achieving the desired results through selective variation of interrelated operating parameters such as input power, operating pressures, plasma energy and spraying distance.

It would furthermore be desirable to provide a plasma spraying system capable of producing a large plasma stream of sufficient energy and of relatively uniform composition across the width thereof. Such plasma system should be capable of entraining the material to be sprayed into the plasma stream or flame and mixing the material in a manner providing relatively dense and uniform coating of such material across a substrate or other workpiece of substantial size.

BRIEF DESCRIPTION OF THE INVENTION

The foregoing and other objects are accomplished in accordance with the present invention by providing plasma spraying systems capable of spraying objects of varying sizes and shapes, including elongated objects of substantial width, in a relatively simple, one-step operation, using considerably less power than most prior art techniques. Such systems are capable of achieving desired results through selective variation of interrelated operating parameters such as input power, operating pressuses, plasma energy and spraying distance. Thus, for a given input power, the plasma stream can be provided with sufficient energy to spray large objects placed at greater distances from the plasma gun, such as by providing a sufficient pressure differential between the inside of the plasma gun and the ambient pressure outside the gun. Using very fine particles of the spray material can greatly enhance the mixing of such particles into the plasma stream in order to improve spraying of objects at greater distances from the plasma gun. The size of an object to be sprayed and the distance of the object from the plasma gun can be selected for a given plasma energy determined by factors such as input power, inert gas flow and pressure differences.

Plasma spraying systems in accordance with the invention are capable of producing a broad plasma stream in order to form relatively uniform coatings on substrates of substantial size. Such plasma systems are characterized by a large pressure difference between the inside and the outside of the plasma gun, so that a substantial shock pattern is created as the plasma stream comprising a mixture of gas and material being sprayed exits the plasma gun and travels to the substrate or other workpiece. Typically, pressures inside of the plasma gun are relatively close to atmospheric, being on the order of at least 400 Torr. (approximately 0.5 atm), and can be made much greater (1–100 atm). On the other hand, large vacuum pumps or other sources of low pressure outside of the plasma gun are coupled to an enclosure for the plasma system in order to create an ambient pressure outside of the plasma gun which is many times lower than the pressure within the plasma gun. Such ambient pressure is no greater than 20 Torr., and is more typically on the order of 5 Torr. and can be as low as 0.001 Torr. The resulting high pressure differential between the inside and the outside of the plasma gun produces a supersonic plasma stream exiting the plasma gun. In addition, the substantial pressure differential creates a substantial shock pattern as the plasma stream exits the gun and begins traveling toward the workpiece. The shock pattern greatly enhances the mixing of the material being sprayed with the exiting gases forming the plasma stream. Because the spray material tends to follow the pattern of the exiting gases, the mixing process is thereby enhanced.

The substantial pressure differential and the shock pattern produced thereby produce a plasma stream which quickly diverges or spreads as it exits the plasma gun so as to form a large, broad plume pattern, particularly at substantial distances from the plasma gun. At the same time, such plasma stream has the requisite energy to deposit uniform, dense coatings on the workpiece, even at substantial distances from the plasma gun which are considerably greater than those normally used in conventional plasma spraying applications and where the plasma stream is of substantial, broad plume configuration so as to cover workpieces of substantial size.

An important aspect of plasma spraying systems according to the invention is the ability of the spray material to thoroughly mix with the gases exiting the plasma gun and then undergoing substantial shock and dispersion. For successful spraying under such conditions, the gas and the spray material must undergo substantial mixing upstream of the shock pattern at the exterior of the plasma gun. The spray material is introduced into the interior of the plasma gun in either particulate or liquid form. Where introduced in particulate form, it is important that the particles be of relatively small size, on the order of 20 microns or even considerably less. Particles of such fineness are more capable of following and mixing with the gas flow as such flow exits the plasma gun, than are much coarser particles. Introduction of the spray material into the plasma gun in liquid form is also advantageous, but is more difficult to accomplish than introducing the material in fine particulate form.

Plasma spraying systems according to the invention are capable of creating dense, uniform coatings on substrates of relatively large size, even when incorporating a plasma gun of relatively conventional design and employing a circular exit nozzle. Plasma guns of such configuration produce a generally circular plasma stream having the requisite energy for producing dense, uniform coatings at substantial distances from the plasma gun. Such circular plasma streams are capable of covering substrates of circular or even square configuration, in relatively efficient fashion and with little wastage. Alternatively, the plasma gun may be provided with a nozzle having an elongated, slit-like opening so as to produce a plasma stream of narrow, elongated configuration. Such long and narrow plasma stream may advantageously be directed across the width of an advancing roll of substrate material so as to coat the substrate as it advances below the plasma gun. By producing an elongated plasma stream, so as to extend across the entire width of the substrate, the oscillating motion that may be required of plasma guns producing circular rather than elongated plasma streams, particularly to properly spray very wide substrates, can be avoided.

Plasma guns for producing an elongated plasma stream may employ a slit-like nozzle but otherwise be of circular configuration. Alternatively, the entire plasma gun may be of elongated configuration.

In one such arrangement of an elongated plasma gun according to the invention, an elongated body has an elongated slot extending out of a hollow interior thereof to form a slit nozzle. Arc gas is introduced into the hollow interior of the body so that such gas flows out of the elongated slot generally in a common direction. A power supply is coupled to produce an arc or electric current discharge within the hollow interior of the body so that the electric current discharge extends out of the elongated slot generally in the common direction of the arc gas.

The production of an electric current discharge extending generally in the same direction as the are gas out of the elongated slot, has been found to produce a broad plume plasma spray of considerable uniformity. Such an arrangement also enables spray material to be introduced at spaced locations across the width of the elongated body so as to be entrained into and carried by the broad plume plasma spray with substantial uniformity. The spray material exits the elongated slot flowing in the same direction as the arc gas and the electric current discharge.

The elongated body may include an elongated anode having an elongated, nozzle-forming slot extending from a hollow interior thereof along a substantial portion of the length thereof. An elongated cathode assembly is disposed within the hollow interior of and extends along substantially the entire length of and forms a space with the adjacent anode. The arc gas is introduced into the space between the anode and the cathode assembly so as to flow out of the nozzle-forming slot. Coupling of a power supply between the anode and the cathode produces the electric current discharge so as to extend out of the nozzle-forming slot in the same direction as the arc gas.

The cathode assembly may comprise an integral member extending continuously along the length of the anode, particularly for lower pressure applications where the cathodic arc tends to diffuse along substantially the entire length of the cathode assembly. Alternatively, for higher pressure applications where there is less tendency for the cathodic arc to diffuse along the width of the cathode assembly, the cathode assembly may be segmented and may comprise a plurality of cathode segments disposed in spaced-apart relation along the length of the anode.

Powder material for spraying is introduced into the elongated plasma gun along the length of the anode. This may be accomplished using a plurality of powder injecting passages spaced-apart along the length of and extending through the anode and into the nozzle-forming slot.

The elongated anode may comprise a pair of opposite, spaced-apart members of like configuration extending along the length of the anode on opposite sides of and spaced-apart from the cathode assembly. Each of the pair of opposite, spaced-apart members of the anode may have a chamber therein extending along the length of the anode for receiving arc gas therein and a slot extending from the chamber to the space between the anode and the cathode assembly for introducing the arc gas into such space. The pair of opposite, spaced-apart members of the anode converge toward each other at a location forward of the cathode assembly and then diverge away from each other to form a diverging nozzle along a substantial portion of the length of the anode. Each of the pair of opposite, spaced-apart members of the anode may also be provided with a chamber therein extending along the length of the anode for circulating cooling fluid through the chamber in each such member.

In a plasma system utilizing an elongated plasma gun of the type described, the gun is disposed within a closed chamber. An elongated strip of material to be treated by the broad plume plasma stream from the plasma gun is advanced within the chamber past the plasma gun. An arrangement of rollers may be used to advance the elongated strip of material into the chamber, past the broad plume plasma stream and out of the chamber. Apparatus is provided for sealing the chamber at locations where the elongated strip of material enters and exits the chamber. A source of low pressure such as a vacuum pump is coupled to the chamber to reduce the ambient pressure within the chamber and outside of the plasma gun to a desired level.

BRIEF DESCRIPTION OF THE DRAWINGS

A better understanding of the invention may be had by reference to the following detailed description taken in conjunction with the accompanying drawings, in which.

DETAILED DESCRIPTION

Figure 1:
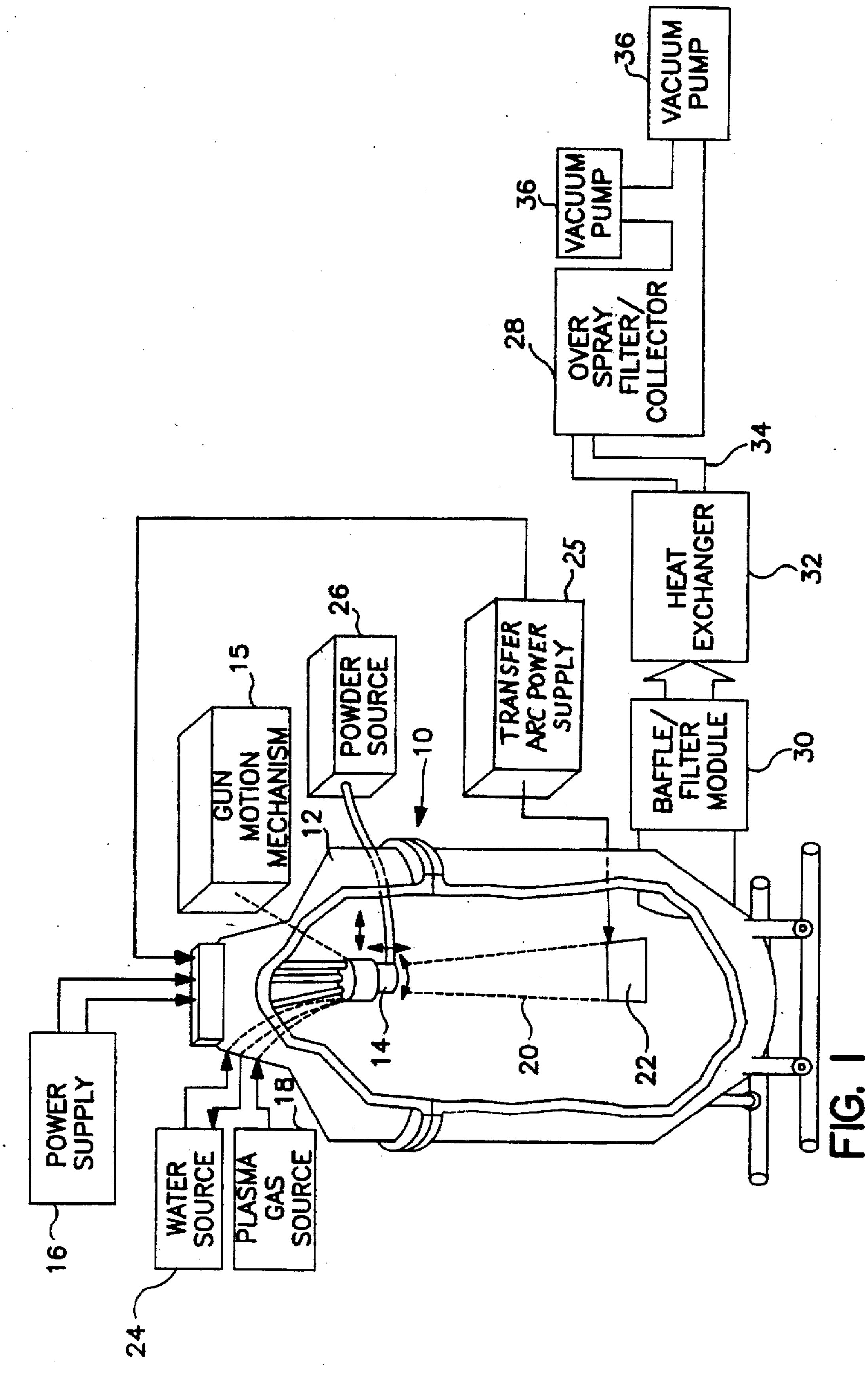
FIG. 1 is a combined block diagram and perspective view, partially broken away, of a plasma system in accordance with the inventions.

FIG. 1 shows a plasma system 10 in accordance with the invention. The plasma system 10 of FIG. 1 includes a closed plasma-chamber 12 in which a plasma gun 14 is mounted. A gun motion mechanism 15 is coupled to produce oscillating yaw or other motions of the plasma gun within the chamber 12, where desired. The plasma gun 14 is coupled to a plasma power supply 16, which may comprise a DC power source coupled to the anode and the cathode of the plasma gun 14. A gas source 18 is coupled to provide arc gas to the plasma gun 14. Such arc gas may comprise any appropriate plasma gas, including particularly inert gases such as argon. Gas from the gas source 18 produces a plasma stream 20 extending from the plasma gun 14 to a workpiece 22. A cooling water source 24, which is coupled to the plasma gun 14, circulates cooling water to the gun 14 to provide necessary cooling thereof. A transfer arc power supply 25 is coupled between the plasma gun 14 and the workpiece 22, to provide a transfer arc where desired.

The plasma system 10 includes a powder source 26 for providing material to be sprayed to the inside of the plasma gun 14. Such material is typically in powdered or particulate form, but may also be introduced in liquid form, as described hereafter. Inside the plasma gun 14, the powder from the source 26 mixes with and becomes entrained within the gas flow from the gas source 18, as the gas is transformed by the plasma gun into the plasma stream 20. The powder particles heat to near melting and mix with the plasma stream 20 in order to form a coating of relatively uniform density on the workpiece 22. The powder particles may comprise aluminum oxide, metals including alloys comprised of two or more metals, or other appropriate materials to be coated onto the workpiece 22.

The workpiece 22 may comprise any substrate, workpiece or target of appropriate composition. In accordance with the invention, and as described hereafter, the workpiece 22 may be of relatively large size, inasmuch as the plasma system 10 is capable of spraying such a workpiece with a relatively uniform, dense coating. The workpiece 22 may comprise a stationary, flat plate of relatively large size, as described hereafter. Alternatively, the workpiece 22 may comprise a roll of substrate material of substantial width, as also described hereafter. The workpiece 22 may comprise any metallic or non-metallic material to be coated. For example, the workpiece 22 may comprise thin aluminum sheeting to be coated with aluminum oxide introduced into the plasma gun 14. Alternatively, the workpiece 22 may comprise a roll of plastic foil, in applications where the plasma system is used not to spray material onto the workpiece 22 but rather to treat the workpiece 22 such as with ultraviolet radiation.

The plasma chamber 12 is coupled at the lower end thereof to an overspray filter/collector 28 through a baffle/filter module 30 and a heat exchanger module 32. The baffle/filter module 30 provides cooling of the overspray from the plasma gun 14 which is not coated on the workpiece 22, before an in-line filter section extracts the majority of the entrained particle matter. Effluent passing through the baffle/filter module 30 is directed through a heat exchanger module 32 into a vacuum manifold 34 which contains the overspray filter/collector module 28. The vacuum manifold 34 communicates with vacuum pumps 36 having sufficient capacity to maintain a desired ambient pressure within the chamber 12 of the plasma system 10. As described hereafter, the vacuum pumps 36 are of sufficient capacity to provide ambient pressure of no greater than 20 Torr. and more typically 5 Torr. or even as low as 0.001 Torr. within the plasma chamber 12.

Figure 2:
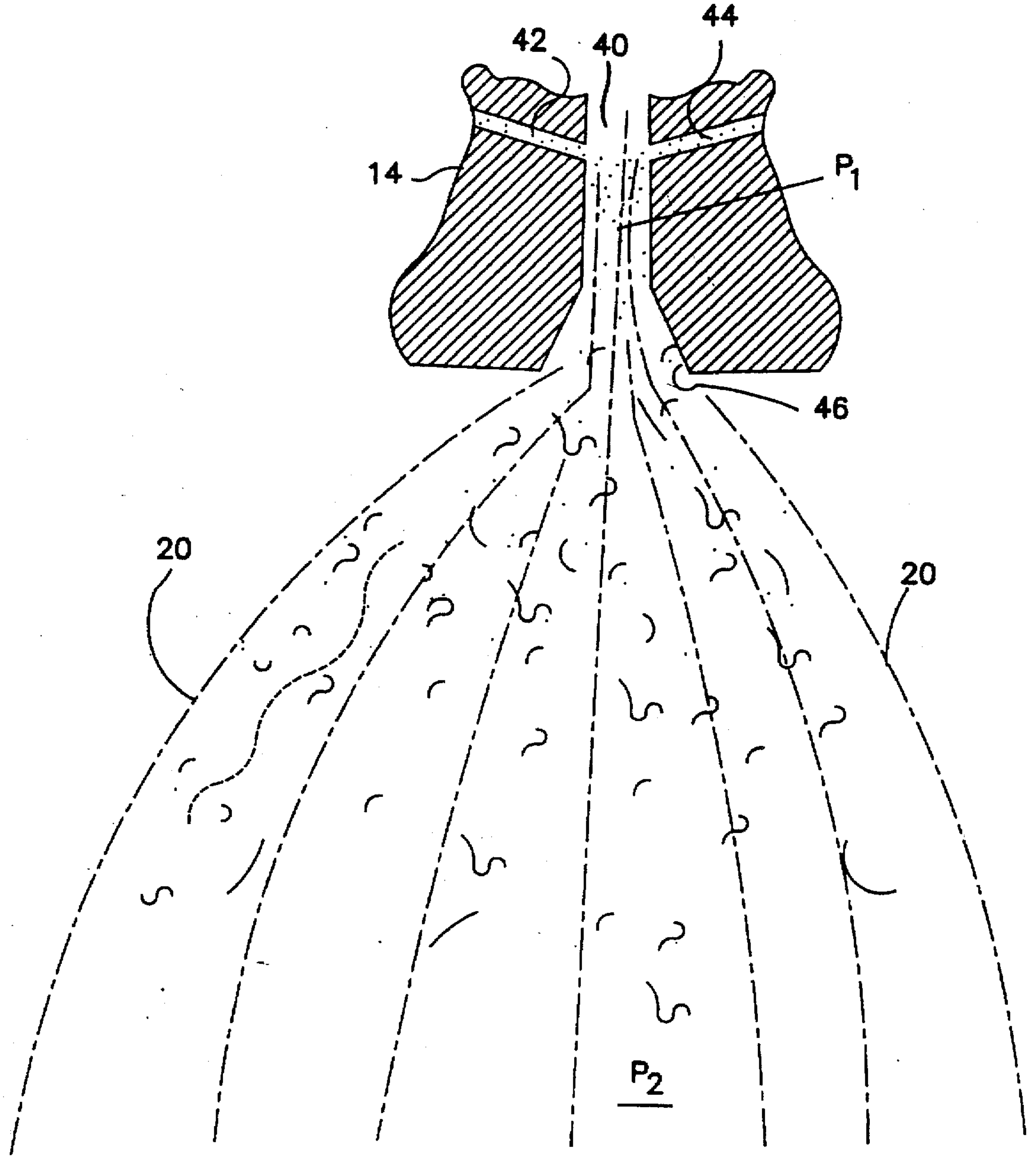
FIG. 2 is a sectional view of a portion of the plasma gun of the system of FIG. 1, illustrating the manner in which a shock pattern is created in the plasma stream exiting the plasma gun by use of a large pressure differential.

FIG. 2 is a sectional view of a portion of the plasma gun 14 showing the manner in which the plasma stream 20 is formed within and exits from the plasma gun 14 in accordance with the invention. The plasma gun 14 has an internal chamber 40 through which the plasma gas from the gas source 18 passes. An arc formed by the plasma power supply 16 produces the plasma stream 20 in conventional fashion. A pair of opposite passages 42 and 44 extend through the walls of the plasma gun 14 to the chamber 40 to deliver powder from the powder source 26. The powder particles entering the chamber 40 from the passages 42 and 44 are entrained into the plasma stream 20 where they mix with the gas of the plasma stream 20 and are heated to a nearly molten state. The heated powder particles are carried by the plasma stream 20 to the workpiece 22 to form the desired coating on the workpiece 22.

In accordance with the invention, the powder is relatively fine and of small particle size on the order of 20 microns or less. Where the particles are of generally spherical configuration, their maximum diameter is 20 microns. More typically, the powder particles have a size of 10 microns or less. It has been found that powder particles of such fineness have a much greater tendency to flow with the gas forming the plasma stream 20, than in the case of coarser particles such as those having a size on the order of 20 microns or greater. The tendency of the fine powder particles in accordance with the invention to more closely follow the gas flow results in a much more enhanced mixing of the powder particles with the gases of the plasma stream 20, particularly upstream of a nozzle 46 at the lower end of the plasma gun 14.

In conventional plasma systems, any tendency of the plasma stream to undergo shock as it exits the plasma gun is minimized if not eliminated by careful control of the operating conditions, to provide uniformity in the plasma operation. This is accomplished through careful control of pressure as well as providing an appropriate exit configuration for the plasma gun. In contrast, the present invention seeks to create a substantial shock pattern just outside of the plasma gun 14, and uses such shock pattern to advantage. The shock pattern is created primarily by providing a substantial difference between a pressure $P_1$ within the plasma gun 14 and an ambient pressure $P_2$ outside of the plasma gun 14 and within the plasma chamber 12 (shown in FIG. 1). Typically, the pressure $P_1$ within the plasma gun 14 is relatively high, being typically on the order of at least about 400 Torr. (about 0.5 arm). As described hereafter, $P_1$ can be made much higher (1–100 atm) where desired, to achieve an even greater pressure differential between $P_1$ and $P_2$. On the other hand, the ambient pressure $P_2$ is made relatively low, such as on the order of 20 Torr. or less. Typically, the pressure $P_2$ is no greater than 5 Torr. and may be as low as 0.001 Torr. or even less, in plasma systems according to the invention. The preferred range of $P_2$ is 10–0.001 Torr.

The substantial difference between the pressures $P_1$ and $P_2$ causes the plasma stream 20 to exit the plasma gun 14 at supersonic velocity. A substantial shock wave is created, and this enhances the mixing of the powder particles with the gases comprising the plasma stream 20. As a result, the plasma stream 20 issues from the plasma gun 14 with sufficient energy so as to be capable of producing a relatively dense and uniform coating on the workpiece 22, even when the workpiece 22 is positioned a substantial distance from the plasma gun 14 such as 2 feet or even 4 feet or greater, as described hereafter. The plasma stream velocity at substantial distances from the gun 14 is also enhanced by the very substantial difference between $P_1$ and $P_2$. By contrast, most conventional plasma spraying systems cannot place the workpiece more than 1–1.5 feet from the plasma gun without severly impairing the plasma stream energy and its ability to coat the workpiece at such greater distances.

For most applications, an adequate pressure differential between $P_1$ and $P_2$ is provided by reducing $P_2$ to a sufficiently low level, using the vacuum pumps of the system. However, the pressure differential can be achieved, where desired, by increasing the pressure $P_1$ within the plasma gun to a sufficiently high level (1–100 arm), either alone or in combination with a reduction in the ambient pressure $P_2$. The plasma gun pressure $P_1$ is determined by the gas flow, the power applied to the gun, and the size of the orifice defining the gun opening.

As noted above, the powder particles from the powder source 26 must be of relatively small size (on the order of 20 microns or less), in order to ensure proper mixing of such particles within the plasma stream 20. However, satisfactory results are also achieved where the coating material is introduced into the plasma gun 14 in liquid rather than particulate form. It is known in the art to heat the coating material into a near molten condition for introduction into a plasma stream being formed within a gun. The nearly molten material need not be heated to the near molten state within the plasma stream, being already in a near molten state when introduced, and therefore mixes with the plasma stream much more quickly. However, the apparatus required for introducing the coating material in liquid form tends to be complex, so that introduction of the material in particulate form is still preferred for most applications because of the relative ease with which it may be done.

As previously described in connection with FIG. 1, the vacuum pumps 36 are employed to create the desired low ambient pressure within the plasma chamber 12 (the pressure $P_2$ of FIG. 2). Other operating conditions being essentially equal, including a typical pressure $P_1$ of at least 400 Torr. (approximately 0.5 atm) within the plasma gun 14, a lower ambient pressure $P_2$ is required in plasma systems according to the invention as compared, for example, with the low pressure plasma system of the type described in previously referred to U.S. Pat. No. 4,328,257 of Muehlberger. The vacuum pumps 36 may be of any appropriate form, such as mechanical pumps or diffusion pumps. Regardless of their form, however, the pumps 36 must be of sufficient capacity to produce the low ambient pressure $P_2$ required.

Figure 3:
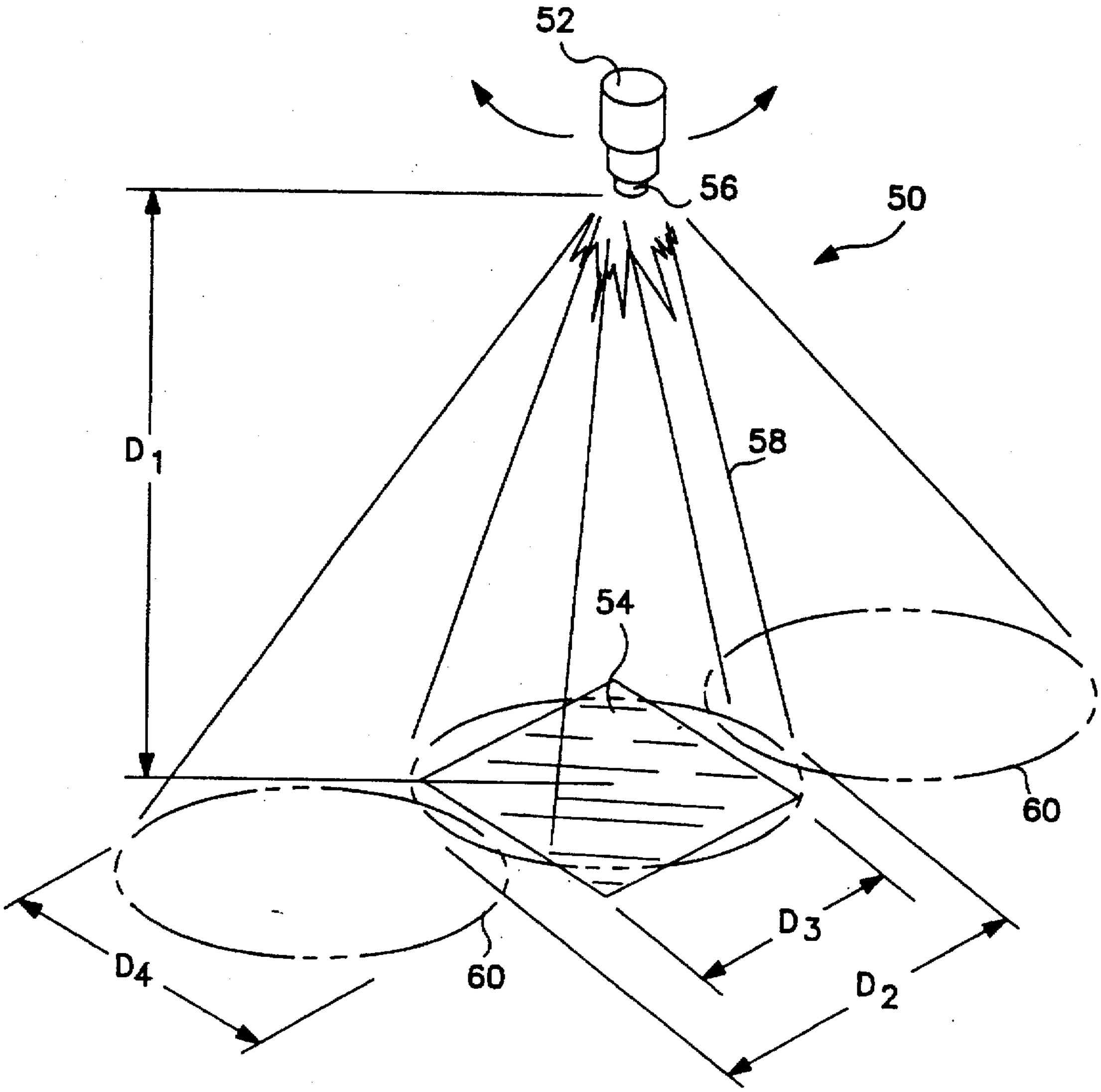
FIG. 3 is a perspective view of a plasma system in accordance with the invention, in which a large spray pattern is achieved using a conventional plasma gun of circular configurations.

FIG. 3 provides a further example of a plasma system 50 according to the invention. The plasma system 50 is like the plasma system 10 of FIG. 1, in its basic essence, so that much of the system 50 is eliminated from FIG. 3 for simplicity of illustration. The plasma system 50 includes a plasma gun 52 of conventional, circular configuration. However, and in accordance with the invention, the coating material supplied to the plasma gun 52 is of appropriate small particle size (or of liquid form), and the vacuum pumps are selected and adjusted to produce an appropriate pressure differential between the ambient pressure $P_2$ and the pressure Pwithin the plasma gun 52.

In the plasma system 50 of FIG. 3, the workpiece 22 comprises a square plate 54 positioned a distance Dfrom a nozzle 56 at the lower end of the plasma gun 52. The plasma gun 52 produces a plasma stream 58. With the plasma gun 52 positioned vertically so as to direct the plasma stream 58 directly downwardly, the plasma stream 58 defines a spray pattern of circular configuration and having a diameter $D_2$ at the distance Dfrom the plasma gun 52. Such pattern covers the entire surface area of the plate 54 having dimensions of $D_3$ along each side thereof.

By coupling the plasma gun 52 to the gun motion mechanism 15 (shown in FIG. 1 and described in detail in previously referred to U.S. Pat. No. 4,328,257), the plasma stream 58 can be caused to sweep back and forth in an oscillating yaw motion at a desired rate. The patterns of coverage of the plasma stream 58 with the plasma gun 52 at the opposite positions of oscillating motion are represented by dotted lines 60 of oval shape and each having a width $D_4$. It will be appreciated that while the plasma stream 58 covers the plate 54 when pointed directly downwardly, the yaw motion may be used to sweep the plasma stream 58 between the opposite positions represented by the dotted lines 60 so as to cover a wide area.

An example of the plasma system 50 of FIG. 3 which was constructed and successfully tested in accordance with the invention utilized a plasma gun 52 of conventional, circular configuration and having a total power capability of 100 KW. Mechanical vacuum pumps were coupled to provide an ambient pressure within the plasma chamber of 5 Torr. The plasma gun was operated under conditions of 47 volts, 1800 amps and a DC power of 84.6 KW. A primary arc gas consisting of argon was provided at a rate of 210 SCFH. A secondary arc gas comprising helium was provided at a rate of 57 SCFH. The enthalpy of the exhaust plasma was determined to be 4805 BTU/lb. The pressure $P_1$ within the plasma gun was 0.4 atm (304 Torr.), while the ambient pressure $P_2$ within the plasma chamber was 0.0066 atm (5 Torr.), producing a ratio $P_2/P_1$ of 0.0165. The plasma stream at the exit of the gun was determined to have a gas temperature of approximately 10,000° K. and an exit flow of Mach 3.2. The isotropic exponent (Gamma), a measure of the state of the gas in the throat of the plasma gun, was 1.28. The sound speed at the plasma throat, a★, was 6,000 ft/sec. The exit flow velocity at V/a★ was 13,140 ft/sec. The flow static temperature, determined at a distance of approximately 1 foot from the nozzle exit, was 4079° K. The flow stagnation pressure, at approximately 1 foot from the nozzle exit, was 0.0856 atm (65 Torr.). The anode throat of the plasma gun had a diameter of 0.5 inches and an exit diameter of 0.75 inches, resulting in an expansion in the nozzle area of 2.25 from the anode throat to the nozzle exit. However, a nozzle expansion ratio, A/A★, of 7.0 suggests a nozzle diameter of 1.32 inches under ideal conditions in which the nozzle is configured to accommodate natural expansion of the plasma stream as adiabatic conversion takes place with respect to the fixed upstream energy.

In the example described, the coating material consisted of alumina ($Al_2O_3$), having an average particle diameter of 5–8 microns. The powder was injected into the gun from opposite sides at a rate of 2.61 lbs/hr, for each side.

The distance $D_1$ between the nozzle of the plasma gun and the substrate was 54 inches. This produced a spray pattern diameter $D_2$ of 15 inches, so as to cover the plate 54 which was square and had a dimension $D_3$ of 12 inches. The dotted line pattern 60 had a width $D_4$ of 18 inches. Yaw motion for the plasma gun was chosen to provide a distance of 2.5 feet between the centers of the opposite dotted line pattern 60. Each sweep of the plasma gun occurred during a period of 0.25 sec. so that the sweep speed of the-spray pattern at the plate 54 was approximately 110 inches/sec. The plate 54 was made of aluminum.

With the conditions set forth above, a uniform 0.0002 inch coating of the alumina was formed on the plate 54. Good adherence of the coating was found to exist for coating thicknesses of as great as 0.0011 inch. For thicker coatings, slight etching or transfer arc cleaning of the plate 54 was found to greatly enhance the bonding of the coating to the plate 54.

As previously noted, the ambient pressure $P_2$ is typically reduced to a level of about 20 Torr. or less to provide a desired pressure differential between $P_1$ and $P_2$. Also, as previously noted, the pressure $P_1$ within the plasma gun can be raised to a high value, within a range of 1–100 atm, either separately or in conjunction with a reduction in $P_2$, to achieve a desired pressure differential. An extreme example of this involves some of the same operating parameters as the detailed example just described, including an enthalpy of 4805 BTU/lb, and an isotropic exponent (Gamma) on the order of the 1.28 value of the prior example. As in the prior example, the gas temperature was approximately 10,000° K., and the sound speed at the plasma throat, a★, was 6000 ft/sec. However, in the present example, the internal gun pressure $P_1$ was selected to be 100 atm (the upper limit of the preferred range according to the invention), while the ambient pressure $P_2$ was chosen to be 0.0000013 atm or 0.001 Torr. (the lower limit of the preferred range). This produced a pressure ratio $P_2/P_1$ of 0.000000013. The resulting exit flow speed of Mach 19.2 was substantially greater than the exit flow speed of Mach 3.2 in the prior example. The exit flow velocity, V/a★, was 16,920 ft/sec, compared with 13,140 ft/sec in the prior example. Whereas the flow static temperature at a distance of approximately 1 foot from the nozzle exit was 4079° K. in the prior example, the temperature in the present example was 188° K., due to the tremendous expansion resulting from the adiabatic conversion of the fixed amount of upstream energy. Similarly, the flow stagnation pressure at i foot from the nozzle exit was 0.00058 arm (0.44 Torr.) instead of the 0.0856 atm (65 Torr.) pressure in the prior example. Whereas the nozzle expansion ratio, A/A★, was 7.0 in the prior example, the ratio was a tremendously increased value of 319,760 in the present example. For an anode throat opening diameter of 1/32 inch (0.0316 inch), the diameter of the opening at the exit end of a nozzle configured to accommodate natural expansion of the plasma stream under ideal conditions was 17.8 inches.

Figure 4:
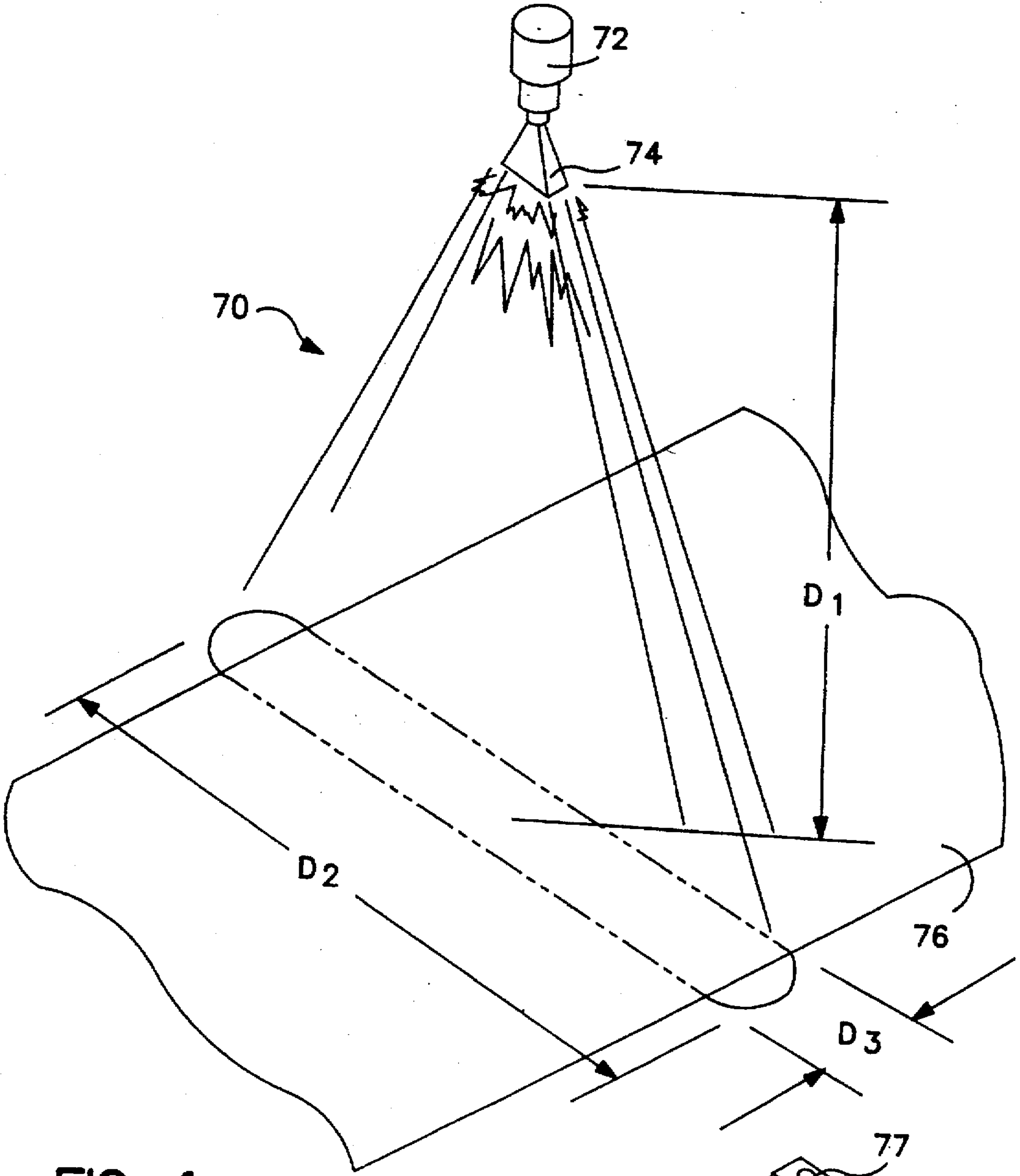
FIG. 4 is a perspective view of a plasma system in accordance with the invention, illustrating the manner in which a slit nozzle may be used in conjunction with a conventional plasma gun of circular configuration to produce a spray pattern of elongated configuration for spraying an elongated substrates

FIG. 4 provides a further example of a plasma system 70 according to the invention. In the plasma system 70, a conventional plasma gun 72, like the plasma gun 52 of FIG. 3 and having a circular configuration, is employed. However, whereas the plasma gun 52 of the FIG. 3 arrangement undergoes oscillating yaw motion as previously described, the plasma gun 72 of FIG. 4 remains stationary, and is instead provided with a slit nozzle 74 at the lower end thereof.

Figure 4A:
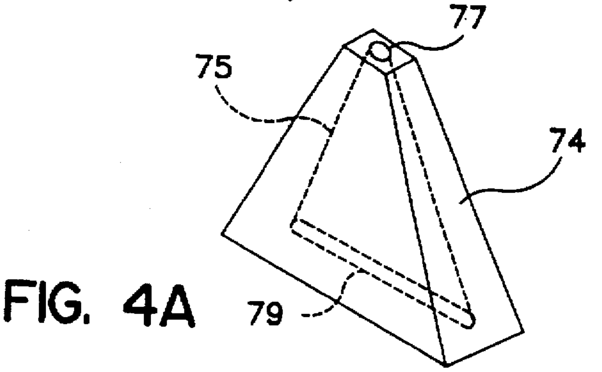
FIG. 4A is a perspective view of the slit nozzle of FIG. 4.

As shown in FIG. 4A, the slit nozzle 74 has an internal passage 75 extending from a circular opening 77 positioned at the lower end of the plasma gun 72 to an elongated, slit-like opening 79 of like area. The slit nozzle 74 provides a smooth transition from the 0.5 inch diameter opening at the bottom of the plasma gun 72 to the slit-like opening 79 which is 1.625 inches long and 0.125 inches wide.

As shown in FIG. 4, the bottom of the slit nozzle 74 is positioned a distance $D_1$ from a workpiece in the form of a moving substrate 76 having a substantial width. However, the width of the substrate 76 is covered by the elongated, relatively narrow spray pattern of length $D_2$ and width $D_3$.

In the particular example of FIG. 4, positioning the bottom of the slit nozzle 74 a distance of 54 inches ($D_1$) from the substrate 76 produced a spray pattern having a length of 54 inches ($D_2$) and a width of 4 inches ($D_3$). Thus, it will be seen that through use of the slit nozzle 74, the resulting spray pattern has a width $D_2$ which is approximately equal to the distance $D_1$ of the substrate 76 from the plasma gun 72, enabling a very wide spray pattern to be obtained at the substantial distance $D_1$ made possible in plasma systems according to the invention.

The distance $D_1$ in the examples of FIGS. 3 and 4 is several times greater than the distance which is normally possible in conventional plasma systems of this type, size and operating range. Yet, because of the substantial pressure differential and the enhanced mixing provided by the resulting substantial shock wave and the use of relatively fine powder, the workpiece has been found to be coated with acceptable density and uniformity at such distances.

Figure 5:
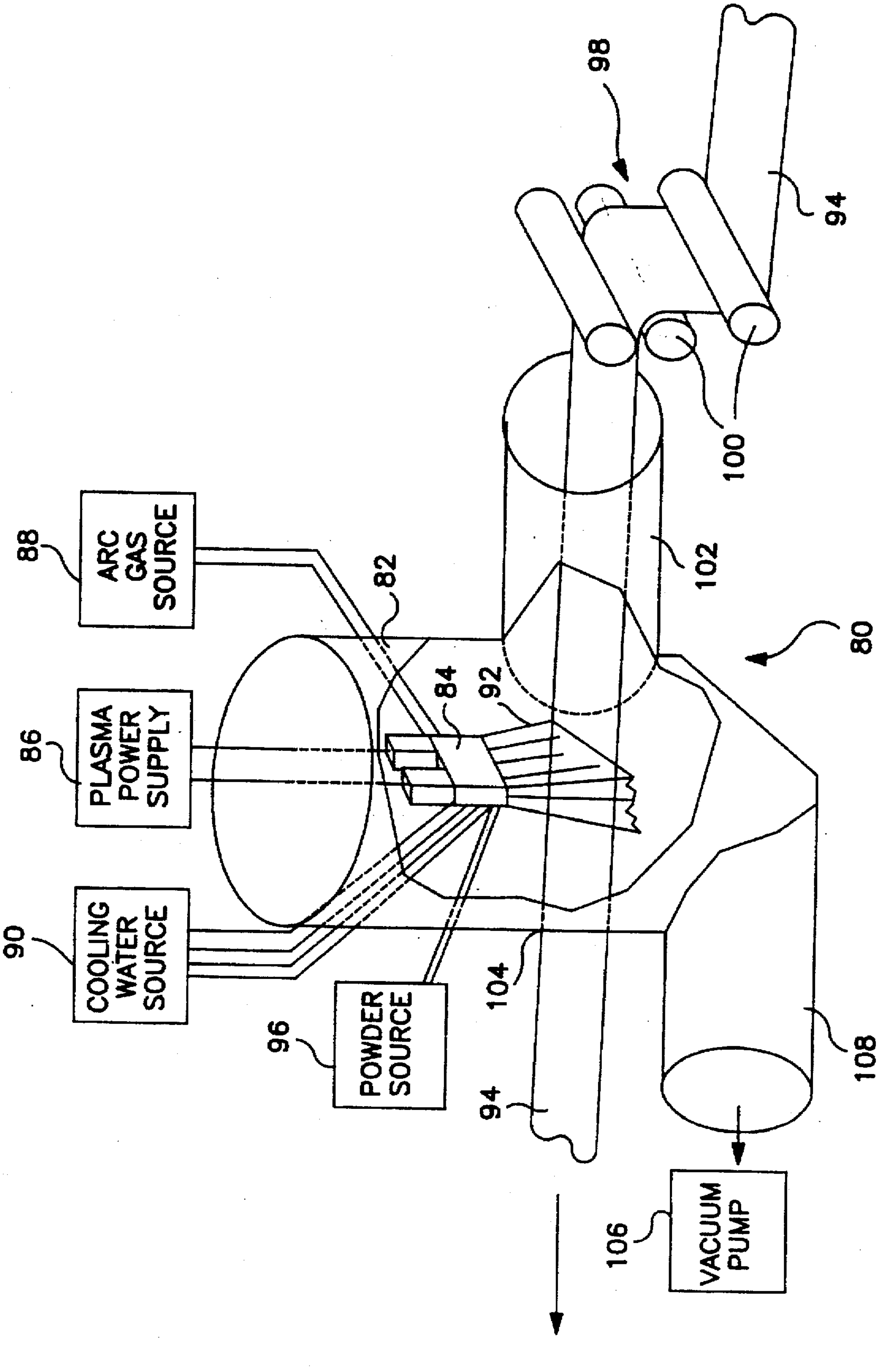
FIG. 5 is a perspective, broken-away view of a plasma system for spraying an advancing roll of substrate material in accordance with the invention.

FIG. 5 shows a further example of a plasma system 80 in accordance with the invention. The plasma system 80 of FIG. 5 includes a closed plasma chamber 82 in which a plasma gun 84 is mounted. The plasma gun 84 is coupled to a plasma power supply 86 which may comprise a DC power source coupled to the anode and the cathode of the plasma gun 84. A gas source 88 is coupled to provide arc gas to the plasma gun 84. Such arc gas may comprise an inert gas such as argon, used in the production of a plasma stream or flame by the plasma gun 84. A cooling water source 90 which is coupled to the plasma gun 84 circulates cooling water to the plasma gun 84 to provide necessary cooling of the plasma gun 84.

Figure 6:
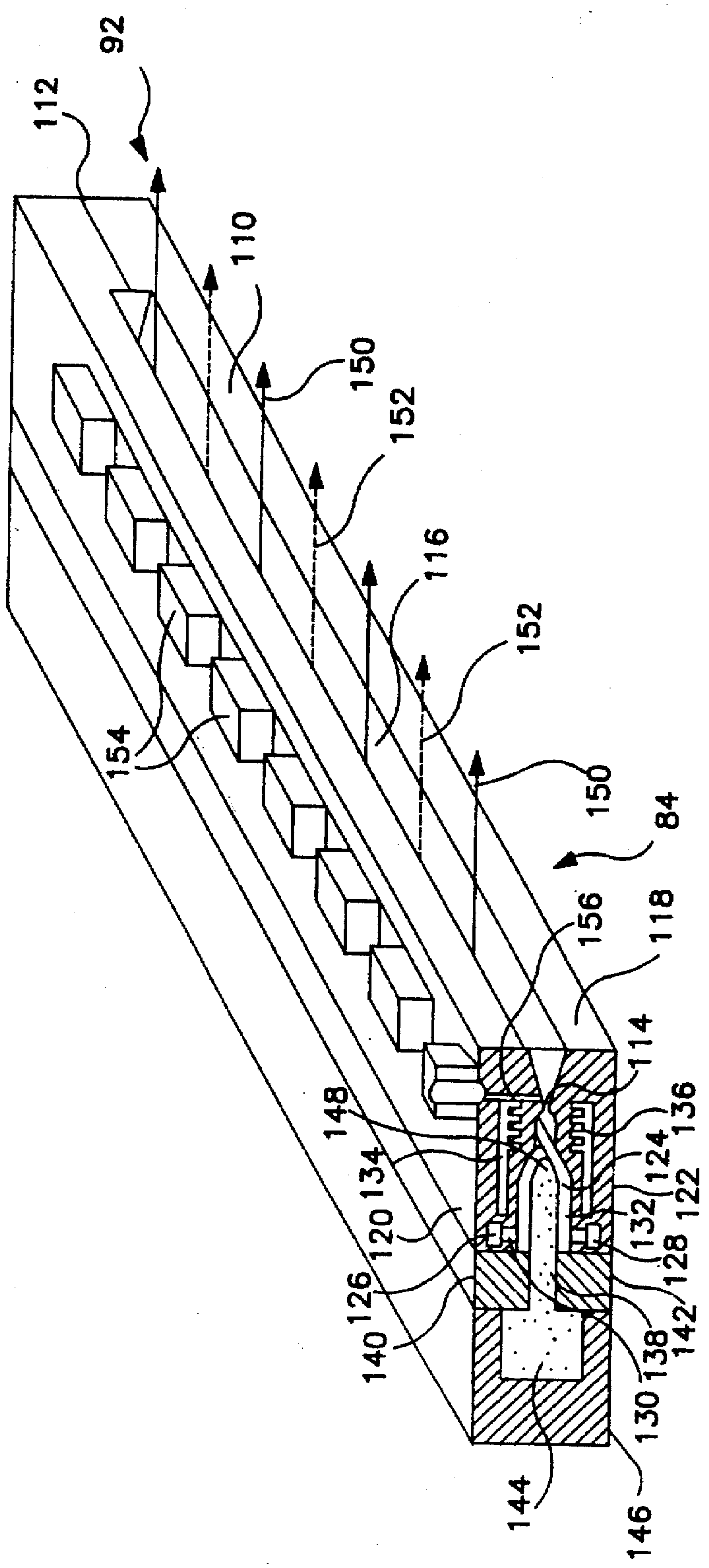
FIG. 6 is a perspective, broken-away, sectional view of a plasma gun of elongated configuration which may be used in the system of FIG. 1 and in which the cathode assembly comprises an integral, continuous common members
Figure 7:
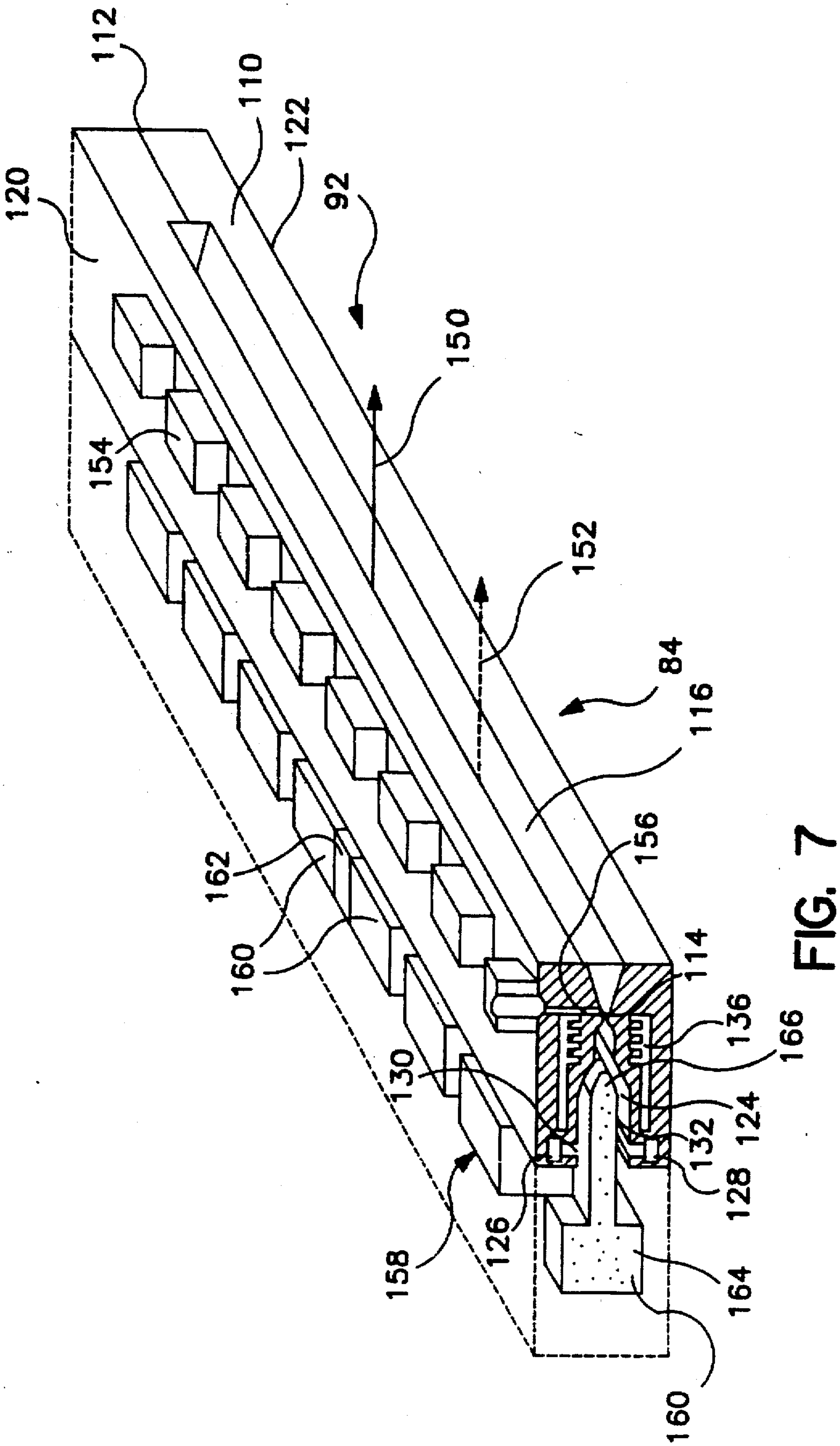
FIG. 7 is a perspective, broken-away, sectional view of a plasma gun of elongated configuration which may be used in the system of FIG. 1 and in which the cathode assembly is segmented.

As described in detail hereafter in FIGS. 6 and 7, the plasma gun 84 produces a broad plume plasma stream 92. The stream 92 is directed onto an elongated strip of material 94, which in this case comprises the substrate, workpiece or target. The strip of material 94 may comprise metal foil or other appropriate material for treatment with the broad plume plasma stream 92. In the present example, the material 94 comprises metal which is sprayed with aluminum oxide particles introduced into the broad plume plasma stream 92 by the plasma gun 84. The aluminum oxide particles are provided to the plasma gun 84 by a powder source 96. While the spray material comprises aluminum oxide in the present example, it can comprise other materials. Also, the material 94 need not comprise a metal foil, but can comprise other materials. Also, the broad plume plasma stream 92 need not be used to spray material but can be used for other treatment such as ultraviolet radiation where the material 94 comprises plastic foil.

The elongated strip of material 94 is relatively wide, and may have a width on the order of i meter or even considerably greater. Nevertheless, the plasma gun 84 is designed to provide the broad plume plasma stream 92 in such a manner that the entire width of the elongated strip of material 94 is treated in relatively uniform fashion.

In the example of FIG. 5, the elongated strip of material 94 is advanced through the plasma chamber 82 by a transport and seal mechanism 98, which includes a plurality of rollers 100. The rollers 100 are rotatably driven to advance the elongated strip of material 94 through an entrance chamber 102 to the interior of the plasma chamber 82 where the material 94 is treated by the broad plume plasma stream 92 produced by the plasma gun 84. The entrance chamber 102 is coupled to the side of the plasma chamber 82. In cases where the plasma chamber 82 is provided with a low ambient pressure therein, as described hereafter, it is necessary to seal the entry and exit of the elongated strip of material 94. Certain spray materials may also require an air-tight entry. In the present example, the rollers 100 act to seal the entry of the elongated strip of material 94 into the plasma chamber 82. A similar roller arrangement (not shown in FIG. 5) is used to seal a substrate exit 104 at the opposite side of the plasma chamber 82, where the elongated strip of material 94 exits the plasma chamber 82. A multiple stage entry can be used where necessary.

The plasma chamber 82 is coupled at the lower end thereof to a vacuum pump 106 through an arrangement 108 which may include a baffle/filter module, a heat exchanger and an overspray filter/collector in the manner of FIG. 1. The vacuum pump 106 is operated to provide the desired ambient pressure within the plasma-chamber 82 in the manner previously described.

A first embodiment of the plasma gun 84 is shown in FIG. 6. Although the plasma gun 84 is vertically disposed in FIG. 5 to direct the broad plume plasma stream 92 downwardly onto the material 94, the embodiments of the plasma gun 84 shown in FIGS. 6 and 7 are horizontally disposed for convenience of illustration. The plasma gun embodiment of FIG. 6 is designed for use in low pressure environments where the internal pressure in the plasma gun is no more than 400 Torr. (about 0.5 atm). For higher internal pressures such as those within the range of 1–100 arm, the embodiment of FIG. 7 described hereafter is preferred.

The plasma gun 84 of FIG. 6 comprises an elongated body 110 having a length in a direction of elongation between a first end 112 and an opposite second end (not shown in FIG. 6 because of the sectioning adjacent such opposite second end). The elongated body 110 includes an elongated nozzle-forming slot 114 at a front edge thereof which extends along a substantial portion of the length of the elongated body 110. The nozzle-forming slot 114 provides the elongated body 110 with a slit nozzle 116. This contrasts with plasma guns of more conventional configuration, such as the plasma guns 52 and 72 in FIGS. 3 and 4 respectively, in which the internal plasma chamber opens into a nozzle of circular or cylindrical configuration.

The elongated body 110 of FIG. 6 includes an anode 118 which may be of integral or multi-piece construction and which is comprised of opposite anode members 120 and 122 of like configuration. The anode members 120 and 122 are spaced apart from each other to form an arc cavity 124 therebetween. The anode members 120 and 122 converge at forward portions thereof to define the nozzle-forming slot 114, before diverging to form the slit nozzle 116. The anode members 120 and 122 are provided with arc gas chambers 126 and 128, respectively, which extend along the lengths of the anode members 120 and 122. The arc gas chambers 126 and 128 are coupled to the gas source 88 shown in FIG. 5 to receive arc gas therein. The arc gas chamber 126 is coupled to the arc cavity 124 by a slot 130 extending along the length of the anode member 120. The arc gas introduced into the arc gas chamber 126 flows through the slot 130 and into the arc cavity 124. In similar fashion, the anode member 122 is provided with a slot 132 extending along the length thereof between the arc gas chamber 128 and the arc cavity 124. Arc gas introduced into the arc gas chamber 128 flows through the slot 132 and into the arc cavity 124.

The anode members 120 and 122 are provided with cooling water chambers 134 and 136, respectively. The cooling water chamber 134 extends along the length of the anode member 120, and is coupled to the cooling water source 90 shown in FIG. 5. The cooling water chamber 134 extends to a region adjacent the nozzle-forming slot 114 within the anode member 120 to provide cooling for the slit nozzle 116. The cooling water chamber 136 within the anode member 122 functions in similar fashion.

The plasma gun configuration of FIG. 6 is characterized by a common cathode 138 comprising a single, integral cathode member extending along the length of the anode forming members 120 and 122. The cathode 138 is disposed between insulators 140 and 142 extending along back edges of the anode members 120 and 122. This electrically insulates the cathode 138 from the anode members 120 and 122. The cathode 138 includes a base 144 which extends rearwardly from the insulators 140 and 142 and which is surrounded by a U-shaped insulator 146. The portion of the cathode 138 between the insulators 140 and 142 is substantially thinner than the base 144 and extends forwardly within the arc cavity 124 to a forward tip portion 148.

As described in connection with FIG. 5, the plasma system 80 includes a plasma power supply 86 coupled to the plasma gun 84. The plasma power supply 86 typically comprises a DC power source coupled between the anode and the cathode of the plasma gun 84. Such a DC power source (which is not shown in FIG. 6) is coupled to the anode 118 and to the cathode 138, with the result that arcs are formed between the anode members 120 and 122 and the cathode 138 in the region in the forward tip portion 148 of the cathode 138. Such arcs comprise a plasma arc or electric current discharge which extends through the nozzle-forming slot 114 and out of the slit nozzle 116 to the exterior of the plasma gun 84, as represented by a plurality of arrows 150 in FIG. 6. At the same time, the arc gas introduced into the arc cavity 124 from the slots 130 and 132 within the anode members 120 and 122 flows through the nozzle-forming slot 114 and out of the slit nozzle 116 of the plasma gun 84, as represented by a plurality of dotted arrows 152 shown in FIG. 6. Together, the electric current discharge and the arc gas form the broad plume plasma stream 92.

In accordance with the invention, the electric current discharge as represented by the arrows 150 extends from the slit nozzle 116 of the plasma gun 84 generally in the common direction of the arrows 150. The arc gas flows from the slit nozzle 116 in essentially the same direction, as represented by the dotted arrows 152. Such uniaxial relationship of the plasma arc or electric current discharge and the arc gas flow has been found to provide relatively uniform temperature distribution across the entire width of the broad plume plasma stream 92 emanating from the slit nozzle 116 of the plasma gun 84. This results in the relatively uniform spraying of the elongated strip of material 94 across the entire width thereof with powder introduced into the plasma gun 84 of FIG. 6, as described hereafter.

As previously noted, the cathode 138 of FIG. 6 comprises a single integral cathode element extending into the arc cavity 124 along the entire length of the elongated body 110. The use of such a single common cathode element is made possible because the particular plasma gun 84 of FIG. 6 is designed for use in low pressure applications. At low pressures of 400 Torr. or less within the arc cavity 124, the cathodic arc attachment is diffused, and this occurs over the entire surface of the forward tip portion 148 of the cathode 138. Because such arc attachment diffusion does not occur to the same extent at higher pressures such as 1 atm or greater, a segmented cathode must be used for such high pressure applications as described hereafter in connection with FIG. 7.

In the plasma gun 84 of FIG. 6, powder to be introduced into the broad plume plasma stream 92 is provided to a plurality of powder injectors 154 mounted along the length of the upper anode member 120 in spaced-apart fashion. The powder injectors 154 are coupled to a common source of pressurized powder such as the powder source 96 shown in FIG. 5. Powder from such common source is introduced into the powder injectors 154, each of which is coupled by a powder passage 156 to the nozzle-forming slot 114. As shown in FIG. 6, each powder passage 156 extends downwardly through the thickness of the anode member 120 to the nozzle-forming slot 114. The powder injected from each powder passage 156 is dispersed into and flows in the direction of the broad plume plasma stream 92 emanating from the slit nozzle 116. A sufficient number of the powder injectors 154 is provided along the length of the plasma gun 84 to provide for a relatively uniform distribution of the powder across the width of the broad plume plasma stream 92.

While the arrangement of FIG. 6 (and FIG. 7 as described hereafter) is shown and described in terms of the plural injectors 154 for introducing the powder, other arrangements can be used as long as the powder is relatively uniformly distributed across the width of the plasma gun 84. For example, a fine feeder can be used, and the powder can be introduced through a slit extending along the length of the anode member 120.

A second embodiment of the plasma gun 84, which may be more suitable than the embodiment of FIG. 6 for applications involving higher pressures, such as those within the range of 1–100 atm within the plasma gun, is shown in FIG. 7. The plasma gun 84 of FIG. 7 is in many respects similar to the plasma gun embodiment of FIG. 6. Accordingly, like reference numerals are used to designate like portions of the plasma gun 84 of FIG. 7. The principal difference lies in the use of a segmented cathode assembly 158 in the embodiment of FIG. 7. As previously noted, the common cathode 138 of FIG. 6 provides adequate diffusion of the cathodic arc attachment over the entire forward tip portion 148, in the presence of low ambient pressure. However, in applications of somewhat higher pressure, the diffusion may be inadequate. In such situations, the segmented cathode assembly 158 can be used.

The segmented cathode assembly 158 of FIG. 7 is comprised of a plurality of individual cathode segments 160 disposed in spaced-apart relation along the length of the plasma gun 84. The cathode segments 160 are electrically insulated from each other by intervening insulators, with one such insulator 162 being shown in FIG. 7. As shown in FIG. 7, each cathode segment 160 has a cross-sectional shape like the 6, and is comprised of FIG. 6, and is comprised of a base 164 and a thinner portion extending forwardly from the base 164 to a forward tip portion 166 within the arc cavity 124. By segmenting the cathode assembly 158 into the individual cathode segments 160, the arrangement of FIG. 7 is able to provide the requisite cathodic arc attachment diffusion along the entire length of the plasma gun, which is necessary to provide the desired temperature uniformity. The individual cathode segments 160 are each coupled to a different DC power source. Alternatively, a single DC power source can be coupled to all of the cathode segments 160, as long as such single power source is provided with a multiple high frequency starter.

The invention has been principally described herein in connection with the spraying of oxide material such as aluminum oxide particles onto an elongated strip of material in the form of an elongated metal foil. As previously noted, however, other spray materials and substrate or workpiece materials can be used. For example metal powders can be sprayed instead of the aluminum oxide material described. In such instances, it is preferred that a transfer arc be provided by coupling a separate DC power source, such as the power supply 25 shown in FIG. 1, between the plasma gun and the elongated strip of material. It is also possible to form a coating of two or more materials by first forming powder from an alloy of the materials and then spraying the powder onto the workpiece. This is much easier to accomplish than in the vapor coating processes of the prior art where the various materials must be separately vaporized before deposition onto the substrate.

In accordance with a further application of plasma systems according to the invention, such systems can be used to make a metal foil by spraying a metal film onto a moving backing, following which the formed metal form is peeled away and removed from the backing. In still further applications of the invention, the broad plasma stream may be used to treat materials without thermal spraying or coating of the materials. In one such example of a chemical treatment, a relatively wide strip of plastic foil may be treated by simply directing the plasma stream thereon. The high concentration of ultraviolet rays within the plasma stream, particularly at higher pressures, provides ultraviolet treatment of the plastic foil.

Figure 8:
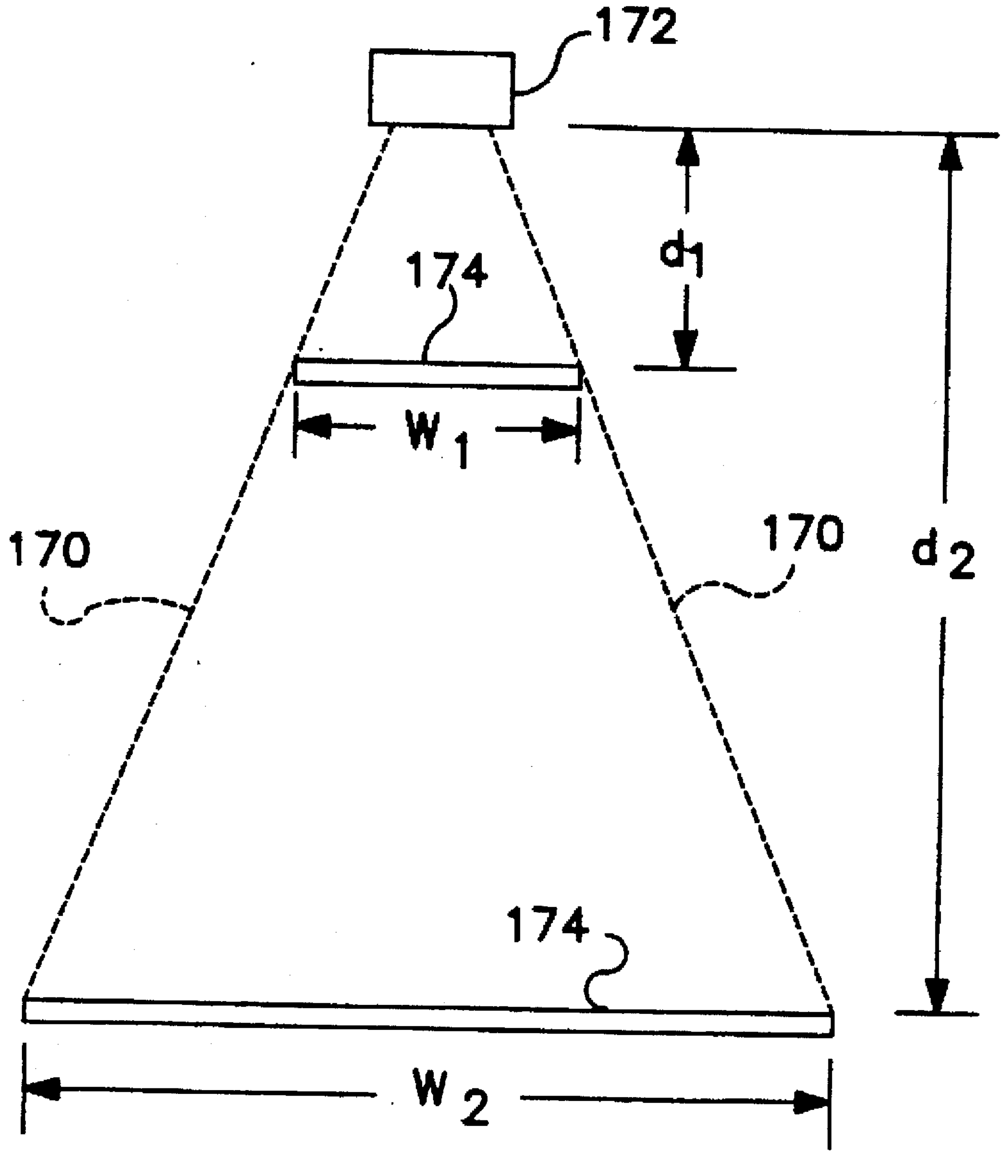
FIG. 8 is a diagrammatic representation of a plasma gun and a target, illustrating the manner in which the width at the target of a plasma stream produced by the plasma gun can vary as a function of distance of the target from the plasma gun.

FIG. 8 illustrates the manner in which the width of the plasma stream varies with distance from the plasma gun. As shown in FIG. 8, a plasma stream 170 produced by a plasma gun 172 diverges in generally linear fashion with increasing distance from the plasma gun 172. If a workpiece 174 is located a first distance $d_1$ from the plasma gun 172 and has a width $w_1$, the stream 170 at the distance $d_1$ is wide enough to cover the entire width $w_1$ of the workpiece 174. For conventional plasma spraying systems using a standard set of operating conditions, the distance $d_1$ is typically on the order of about 1 foot. At a distance of 1 foot, the stream 170 typically has sufficient energy to accomplish the desired spraying or other treatment of the workpiece 174, both in atmospheric environments and in low pressure environments such as where vacuum pumps are coupled to a closed chamber for the plasma system.

At greater distances of the workpiece 174 from the plasma gun 172, such as at the distance $d_2$ shown in FIG. 8, the diverging plasma stream 170 is wider so that a workpiece 174 of width $w_2$ substantially greater than $w_1$ can be sprayed or otherwise treated. In the example of FIG. 8, $d_2$ is approximately 4 times greater than $d_1$ (approximately 4 feet) and $w_2$ is approximately 4 times greater than $w_1$. At the same time, the energy of the plasma stream 22 at the distance $d_2$ is less than at the distance $d_1$. Whether the stream energy is sufficient for spraying or other treatment of the workpiece 174 at the distance $d_2$ depends on various operating conditions and particularly on the plasma system environment. In the very low ambient pressure conditions according to the present invention, for example, the energy loss at $d_2$ when compared with $d_1$ is much less than in the case of plasma systems operating in atmosphere. Consequently, in very low pressure spraying environments, spraying or other treatment at a distance $d_2$ of as much as 4 feet or more has been found to produce satisfactory results, as noted in the examples of FIGS. 3 and 4. However, in higher pressure systems, and particularly in atmospheric systems, the dissipation of stream energy with increasing distance is much greater, so that the stream energy is usually inadequate at a distance of 4 feet.

Knowing the manner in which a plasma stream diverges and the energy thereof attenuates with increasing distance from the plasma gun, particularly in a low pressure environment, enables the scaling of factors such as distance, stream width and energy to optimize operating conditions for various applications. For example, the distance can be increased until the stream has sufficient width to cover the workpiece. If the stream energy at that distance is inadequate, it may be possible to increase the energy to an acceptable level by reducing the ambient pressure within the chamber of the plasma system. In addition, the coating can be enhanced by spraying very small particles or a liquid, as previously noted. Alternatively, the workpiece can be moved away from the plasma gun until a distance is reached at which minimum acceptable energy is present. If the stream is not wide enough at this distance, it may be possible to increase the width of the plasma stream at that distance by using an elongated plasma gun configuration in the manner of FIGS. 6 and 7 described above.

As previously discussed, the distance of the workpiece from the plasma gun can be selected in relation to other operating parameters such as input power, operating pressures and plasma energy to achieve a desired result. Other conditions being equal, an increase in input power will increase the energy of the plasma stream. Of course, for a given input power, the stream energy can be greatly increased by increasing the pressure differential. As a result, plasma systems according to the invention are capable of spraying objects of varying sizes and shapes, including elongated objects of substantial width, in a relatively simple, one-step operation.

While various forms and modifications have been suggested, it will be appreciated that the invention is not limited thereto but encompasses all expedients and variations falling within the scope of the appended claims.

What is claimed is:

1. A plasma gun comprising the combination of:

an elongated anode having an elongated, nozzle-forming slot extending from a hollow interior thereof along a substantial portion of a length of the anode;

an elongated cathode assembly disposed within the hollow interior of and extending along substantially the entire length of and forming a space with the anodes;

a power supply coupled between the anode and the cathodes; and means for introducing an arc gas into the space between the anode and the cathode assembly so that the gas flows out of the nozzle-forming slot.

2. A plasma gun in accordance with claim 1, wherein the power supply produces an electric current discharge which extends out of the nozzle-forming slot generally in the same direction as a direction of flow of the are gas out of the nozzle-forming slot.

3. A plasma gun in accordance with claim 2, further including means for introducing powder into the nozzle-forming slot.

4. A plasma gun in accordance with claim 3, wherein the means for introducing powder comprises a plurality of powder injecting passages spaced-apart along the length of and extending through the node and into the nozzle-forming slot.

5. A plasma gun in accordance with claim 11, wherein the cathode assembly comprises an integral member extending continuously along the length of the anode.

6. A plasma gun in accordance with claim 5, further comprising a chamber containing the anode and the cathode assembly and means for providing a pressure within the chamber which is substantially lower than a pressure outside of the chamber.

7. A plasma gun in accordance with claim 1, wherein the cathode assembly is segmented and comprises a plurality of cathode segments disposed in spaced-apart relationship along the length of the anode.

8. A plasma gun in accordance with claim 1, wherein the anode is comprised of a pair of opposite, spaced-apart members of like configuration extending along the length thereof on opposite sides of and spaced-apart from the cathode assembly.

9. A plasma gun in accordance with claim 8, wherein each of the pair of opposite, spaced-apart members of the anode has a chamber therein extending along the length of the anode for receiving arc gas therein and a slot extending from the chamber to the space between the anode and the cathode assembly for introducing the arc gas into the space.

10. A plasma gun in accordance with claim 8, wherein the pair of opposite, spaced-apart members of the anode converge toward each other at a location forward of the cathode assembly and then diverge away from each other to form a diverging nozzle along a substantial portion of the length of the anode.

11. A plasma gun in accordance with claim 8, wherein each of the pair of opposite, spaced-apart members of the anode has a chamber therein extending along the length of the anode, and means for circulating cooling fluid through the chamber in each member.

12. A plasma gun comprising the combination of:

an elongated body having an elongated slot therein forming a nozzle, the elongated slot extending out of the body from a hollow interior therein;

means for introducing an arc gas into the hollow interior of the body so that the arc gas flows out of the elongated slot generally in a common directions and means for producing an electric current discharge within the hollow interior of the body, the electric current discharge extending out of the elongated slot generally in the common direction.

13. A plasma gun in accordance with claim 12, further including means for introducing powder into the elongated slot.

14. A plasma gun in accordance with claim 12, wherein the elongated body includes a pair of opposite, spaced-apart anode members extending along the length of the elongated body and forming the elongated slot therebetween, and a cathode assembly disposed between and spaced-apart from each of the pair of opposite, spaced-apart anode members along the length of the elongated body.

15. A plasma gun in accordance with claim 14, wherein the cathode assembly is comprised of a plurality of cathode segments spaced-apart along the length of the elongated body.

16. A plasma gun in accordance with claim 14, wherein each of the pair of anode members has a slot therein extending along the length of the elongated body for introducing arc gas into spaces between the pair of anode members and the cathode assembly.

* * * * *

UNITED STATES PATENT AND TRADEMARK OFFICE
CERTIFICATE OF CORRECTION

PATENT NO. : 5,679,167
DATED : October 21, 1997
INVENTOR(S) : Erich Muehlberger

It is certified that error appears in the above-identified patent and that said Letters Patent is hereby corrected as shown below:

Column 17, line 49, delete "claim 11" and substitute therefor --claim 1--.

Column 18, line 33, delete "directions" and substitute therefor--direction;--

Signed and Sealed this

Tenth Day of February, 1998

Attest:

BRUCE LEHMAN

*Attesting Officer* *Commissioner of Patents and Trademarks*